United States Patent [19]
Konno et al.

[11] Patent Number: 5,278,725
[45] Date of Patent: Jan. 11, 1994

[54] FOLDABLE ELECTRONIC APPARATUS HAVING A HOLLOW HINGE ASSEMBLY THROUGH WHICH A FLEXIBLE CABLE IS ROUTED

[75] Inventors: Masaki Konno; Shuji Itoh, both of Yokohama, Japan

[73] Assignee: Matsushita Electric Industrial Co., Ltd., Osaka, Japan

[21] Appl. No.: 864,667

[22] Filed: Apr. 7, 1992

[30] Foreign Application Priority Data

Apr. 12, 1991 [JP] Japan .................. 3-106353

[51] Int. Cl.$^5$ .................. H05K 5/02; H05K 7/16; E05D 3/06; H01R 3/00
[52] U.S. Cl. .................. 361/680; 16/223; 16/366; 439/165; 361/729; 361/749
[58] Field of Search .................. 16/223, 365, 366, 378, 16/379; 439/164, 165; 364/708; 361/380, 390-395, 398, 399

[56] References Cited

U.S. PATENT DOCUMENTS

| | | | |
|---|---|---|---|
| 4,825,395 | 4/1989 | Kinser, Jr. et al. | 16/366 X |
| 4,842,531 | 6/1989 | Takemura | 439/165 |
| 4,961,126 | 10/1990 | Suzuki | 439/164 X |

*Primary Examiner*—Leo P. Picard
*Assistant Examiner*—Michael W. Phillips
*Attorney, Agent, or Firm*—Stevens, Davis, Miller & Mosher

[57] ABSTRACT

An electronic apparatus comprises a main body unit, a keyboard unit, a hinge portion for mechanically connecting the main body unit with the keyboard unit, and a flexible cable electrically connecting the main body unit with the keyboard unit. The hinge portion includes a first hinge portion connected to the main body unit, a second hinge portion connected to the keyboard unit and a holding member provided between the main body unit and the keyboard unit for rotatably holding the first hinge portion and the second hinge portion. The keyboard unit is rotatable relative to the main body unit about both the first and the second hinge portions so that an angle of rotation of the keyboard unit relative to the main body unit may be increased.

5 Claims, 5 Drawing Sheets

FIG. IA PRIOR ART
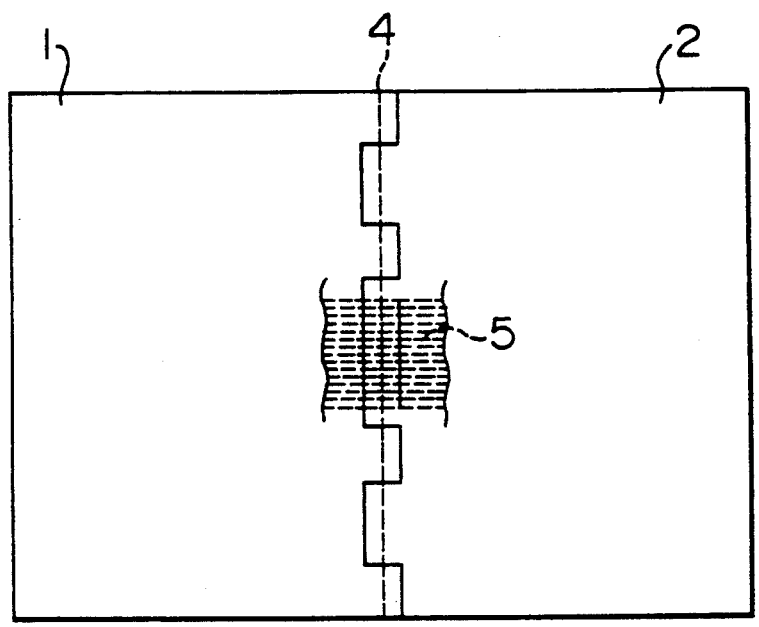
FIG. IB PRIOR ART
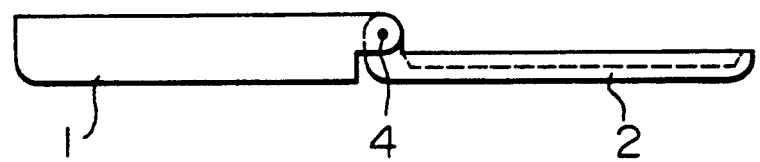

FOLDABLE ELECTRONIC APPARATUS HAVING A HOLLOW HINGE ASSEMBLY THROUGH WHICH A FLEXIBLE CABLE IS ROUTED

BACKGROUND OF THE INVENTION

This invention relates to an electronic instrument or apparatus of the structure that a main body unit and a keyboard unit are separated from each other, which apparatus comprises a hinge portion serving to mechanically connect or combine the main body unit with the keyboard unit and a flexible cable serving to electrically connect between them.

As shown in FIGS. 1A and 1B, in a conventional electronic apparatus in which a main body unit 1 and a keyboard unit 2 are separated from each other, the main body unit 1 and the keyboard unit 2 are electrically connected by a flexible cable 5 and mechanically combined by a hinge portion 4 so as to be able to be opened and closed freely. It is designed that the main body unit 1 and the keyboard unit 2 are opened when the apparatus is in use while they can be closed when out of use.

In such conventional electronic apparatus, since the flexible cable 5 is made to pass straight horizontally through the hinge portion 4, the hinge portion 4 can be rotated only up to about 180°. If it is intended to further rotate the hinge portion 4, the flexible cable 5 is required to have an extra length, however, there is a problem that it is difficult to take a space for receiving the extra cable. In consequence, since it is impossible to rotate beyond 180°, the openable angle is restricted by the hinge portion 4. However, in case of rotating by force beyond the restriction on the openable angle, the hinge portion 4 was broken in some cases. Further, if the width of the flexible cable 5 is limited, there is caused a problem that a plurality of pieces of flexible cable 5 must be passed through the hinge portion 4.

SUMMARY OF THE INVENTION

It is an object of the present invention to provide an electronic apparatus overcoming the above-described problems encountered with the conventional apparatus.

It is another object of the invention to provide an electronic apparatus in which a main body unit and a keyboard unit are connected together through hinge means in such a manner that the keyboard unit is rotatable relative to the main body unit up to an increased rotation angle, thereby enabling to prevent breakage of the hinge means and to improve operationability whichever it is operated on a user's hand or on a table.

It is further object of the invention to provide an electronic apparatus which assures an electrical connection between a main body unit and a keyboard unit by a single piece of flexible cable without suffering from the problem of limitation in the width of the flexible cable.

According to the invention, there is provided an electronic apparatus comprising a main body unit, keyboard unit, hinge means for mechanically connecting the main body unit with the keyboard unit, and a flexible cable electrically connecting the main body unit with the keyboard unit, the hinge means including a first hinge portion connected to the main body unit, a second hinge portion connected to the keyboard unit and a holding member provided between the main body unit and the keyboard unit for rotatably holding the first hinge portion and the second hinge portion so as to enable the keyboard unit to rotate relative to the main body unit about the first and the second hinge portions.

According to the invention, the keyboard unit can be rotated relative to the main body unit by an increased rotation angle (an angle of 360 degrees, for example) since the keyboard unit and the main body unit are connected together through two hinge portions.

Preferably, the flexible cable has a U-like shape including parallel leg portions and a bottom portion extending between the leg portions, and the flexible cable of the U-like shape is constructed to be twisted and curved during the relative rotation between the main body unit and the keyboard unit. In this case, each of the leg portions is disposed along an axis of one of the first and second hinge portions, and the bottom portion is disposed in the holding member.

FIGS. 1A and 1B are a plan view and a side view, respectively, of an example of conventional electronic apparatus;

DETAILED DESCRIPTION OF THE PREFERRED EMBODIMENTS

Figure 2A:
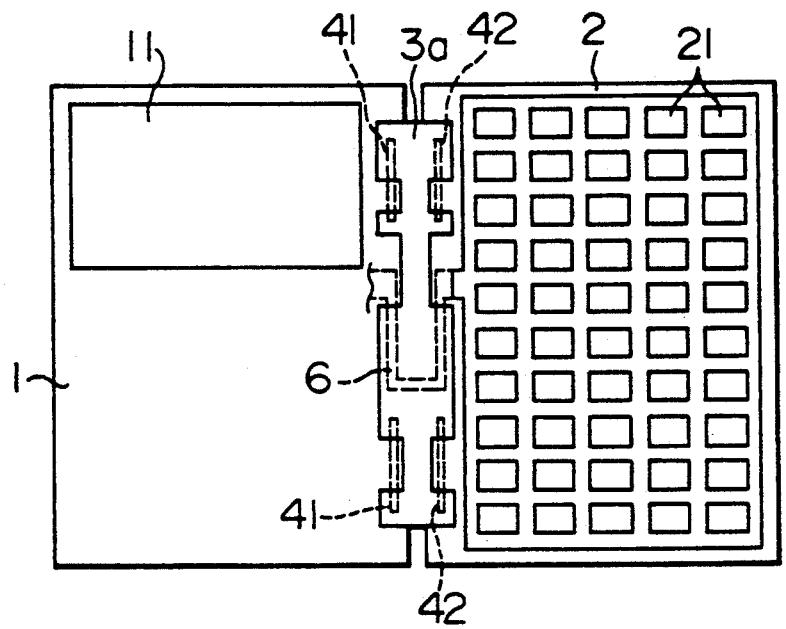
FIGS. 2A, 2B and 2C are a plan view and side views, respectively, of an electronic apparatus according to a first embodiment of the invention.

Referring to FIGS. 2A to 2D which show a first embodiment of the invention, an electronic apparatus includes a main body unit 1 which is equipped therein with a principal circuit part. The unit 1 includes a lower body 1a and an upper body 1b connected together. The upper body 1b has a display panel 11 at its front surface. The main body unit 1 is mechanically connected or combined through a hinge portion with a keyboard unit 2 having sheet-like keyboards 21.

The hinge portion has a double-hinge structure which includes a first hinge portion, a second hinge portion and a holding member 3 for rotatably holding the first and the second hinge portions. The first hinge portion includes two hinges 41 integrally connected to one longitudinal edge of the lower body 1a of the main body unit 1, and a tubular member 43 integrally connected to the one longitudinal edge of the lower body 1a and located between the hinges 41 coaxially with the latter. As shown in FIG. 2D, a member 43a of semi-circular cross-section is connected to a longitudinal edge of the upper body 1b the main body unit 1, while a member 43b of semi-circular cross-section is connected to a longitudinal edge of the lower body 1a. The members 43a and 43b constitute the tubular member 43 when the lower body 1a and the upper body 1b are integrally connected together.

The second hinge portion includes two hinges 42 integrally connected to one longitudinal edge of the keyboard unit 2, and a tubular member 44 integrally connected to the one longitudinal edge of the keyboard unit 2 and located between the hinges 42 coaxially with the latter.

A flexible cable 6 is bent in the shape of a letter U. One of two parallel leg portions 6a of the flexible cable 6 extends coaxially with the hinges 41 and the tubular member 43 to pass through the tubular member 43, while the other leg portion 6a extends coaxially with the hinges 42 and the tubular member 44 to pass through the tubular member 44. The flexible cable 6 has also a bottom portion 6b extending substantially perpendicularly to the parallel portions 6a and connected to the latter. The leg portions 6a and the bottom portion 6b are located between an upper holding member 39 and a lower holding member 36 of the holding member 3. One end of the flexible cable 6 is connected to a circuit part in the keyboard unit 2, while the other end of the flexible cable 6 is connected to the circuit part in the main body unit 1 through a terminal 6c.

The holding member 3 includes the upper holding member 3a and the lower holding member 3b which are connected together by suitable means in a face-to-face relationship in such a manner as to rotatably hold the hinges 41 and 42 between the upper and the lower support members 3a and 3b.

Figure 3:
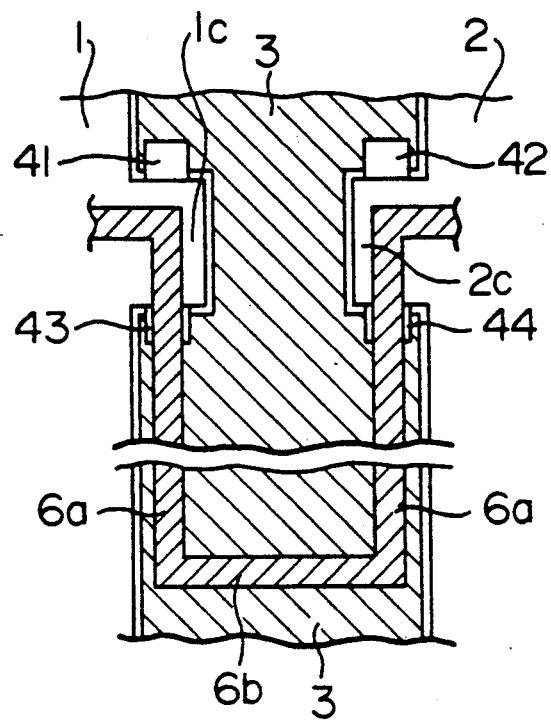
FIG. 3 is a sectional view showing essential portions of an electronic apparatus according to a second embodiment of the invention.
Figure 4:
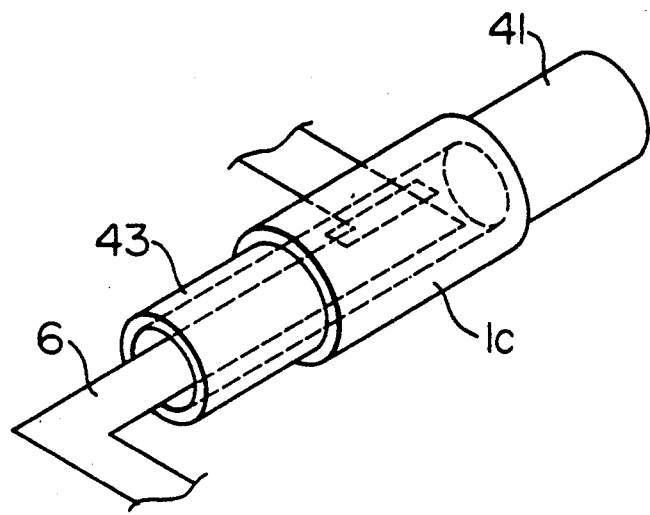
FIG. 4 is a perspective view of the apparatus shown in FIG. 3.

In the second embodiment as shown in FIGS. 3 and 4, a hinge 41 and a tubular member 43 are connected together through a projection 1c integrally connected to the main body unit 1. Similarly, a hinge 42 and a tubular member 44 are connected together through a projection 2c integrally connected to the keyboard unit 2. A flexible cable 6 is bent in the shape of a letter U as similar to the flexible cable of the first embodiment. One of two parallel leg portions 6a of the flexible cable 6 extends coaxially with the hinge 41 and the tubular member 43 to pass through the projection 1c and the tubular member 43, while the other leg portions 6a extends coaxially with the hinge 42 and the tubular member 44 to pass through the projection 2c and the tubular member 44. The flexible cable 6 has also a bottom portion 6b extending substantially perpendicularly to the leg portions 6a and connected to the latter. The leg portions 6a and the bottom portion 6b are located in the holding member 3; i.e., between the upper and the lower holding members (See 3a and 3b in FIG. 4D.).

In the first and the second embodiments, when the hinge portion including the hinges 41, 42 and the tubular members 43, 44 is rotated, the leg portions 6a of the flexible cable 6, which have a large length, are twisted and the bottom portion 6b is deformed into a curved configuration. With such construction, an excessive force is not exerted on the flexible cable 6 even if the hinge portion is rotated through a large angle.

Figure 5:
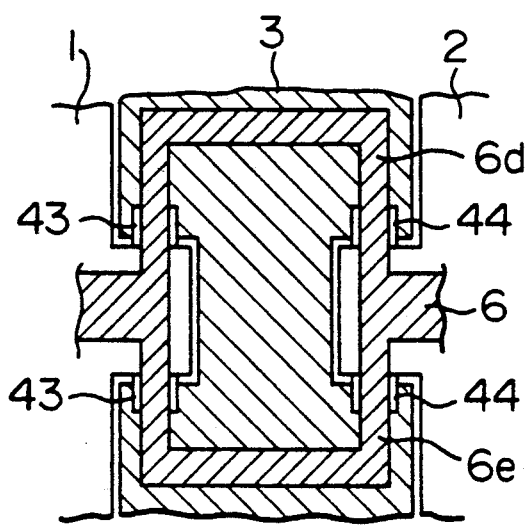
FIG. 5 is a sectional view showing essential portions of an electronic apparatus according to a third embodiment of the invention.

When the number of wirings distributed in the flexible cable 6 is large, the flexible cable 6 may be branched into two or more portions. In the third embodiment of the invention as shown in FIG. 5, the flexible cable 6 is branched into two portions 6d and 6e. Each of the two portions extends to pass through the tubular members 43 and 44. In this third embodiment, hinges corresponding to the hinges 41 and 42 of the first embodiment are provided in the same manner as shown in FIG. 2D.

Next, the description will be given on the operation of the apparatuses constructed as described hereinabove.

The main body unit 1 having the hinges 41 and the tubular member 43 connected thereto is rotatable relative to the holding member 3 up to an angle of 180 degrees or a little more about hinges 41, and the keyboard unit 2 having the hinges 42 and the tubular member 44 connected thereto is rotatable relative to the holding member up to an angle of 180 degrees or a little more about the hinges 42. In other words, the hinges 41 are rotatable together with the tubular member 43 relative to the holding member 3 by an angle of about 180 degrees, and the hinges 42 are rotatable together with the tubular member 44 relative to the holding member 3 by an angle of about 180 degrees.

Figure 2B:
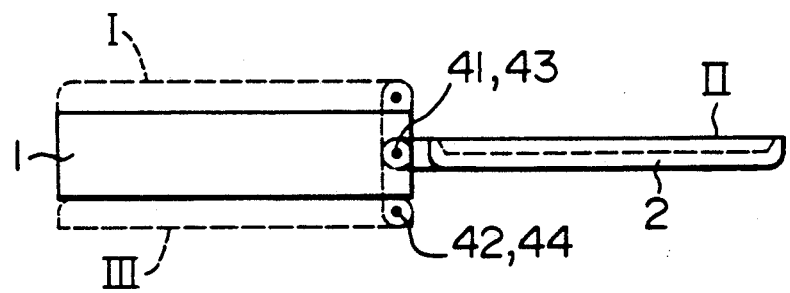
Figure 2C:
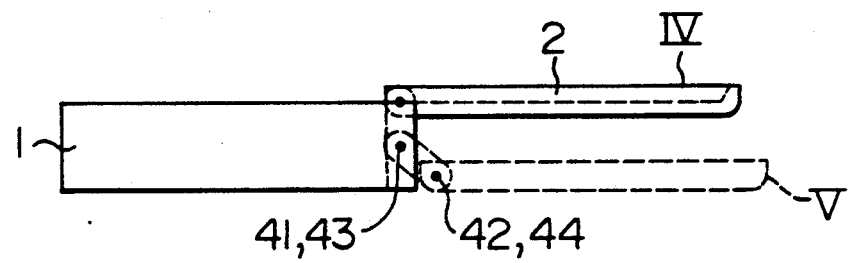
Figure 2D:
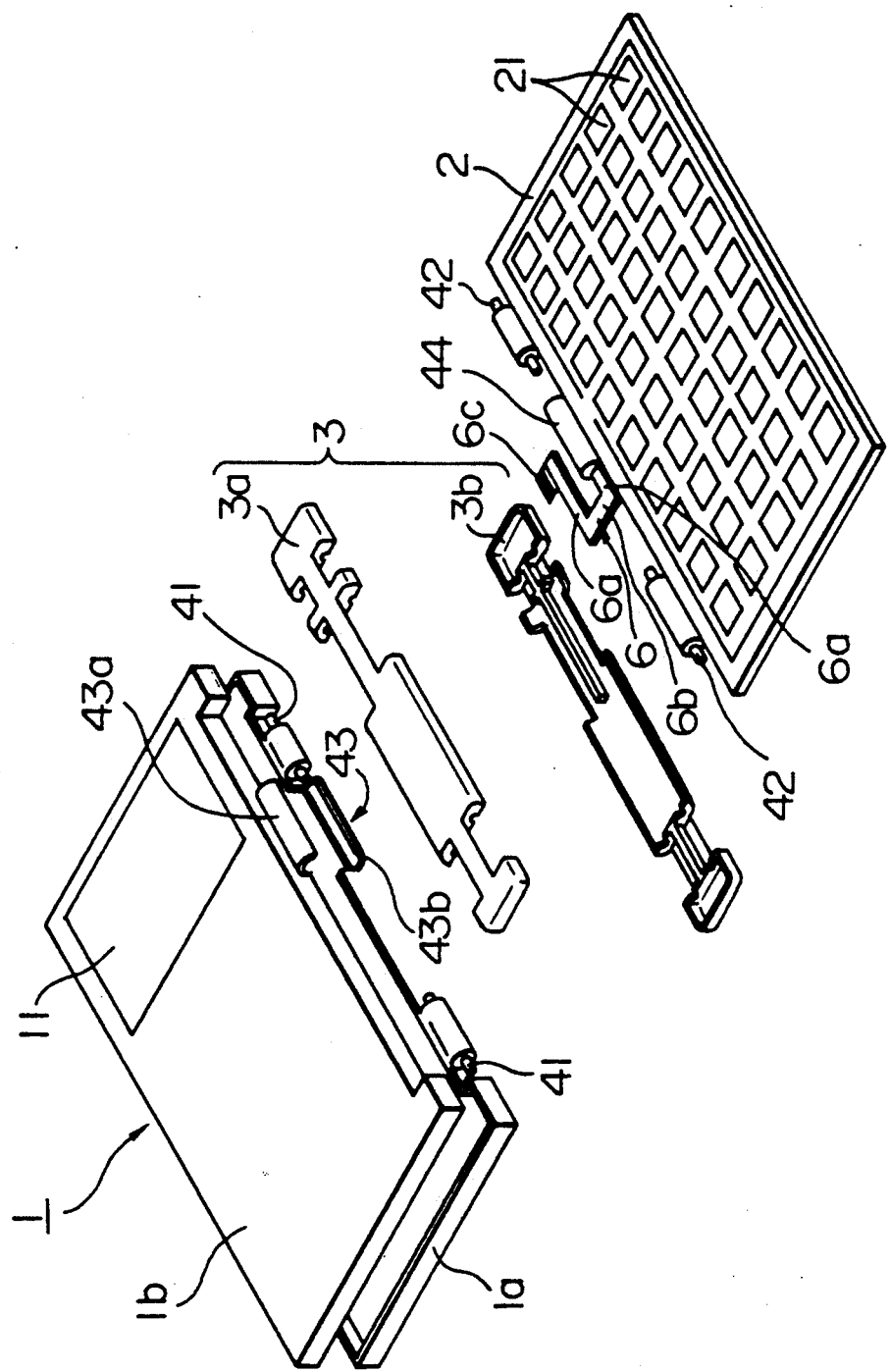
FIG. 2D is an exploded perspective view of the apparatus according to the first embodiment.

In a state (II) shown by a solid line in FIG. 2B, in which the keyboard unit 2 is opened, the flexible cable 6 is kept flat without being deformed as shown in FIGS. 2D and 3-5. When, from this state (II), the hinges 41 and the tubular member 43 are rotated in a counterclockwise direction through an angle of 90 degrees and then the hinges 42 and the tubular member 44 are rotated in a counterclockwise direction by an angle of 90 degrees, the keyboard unit 2 is closed as shown by a dotted line (I) in FIG. 2B. The state shown by the dotted line (I) is suitable for keeping or carrying the apparatus. In this state (I), the flexible cable 6 is twisted at the leg portions 6a extending along the axes of the hinges and is curved at the inlet and outlet of the hinge portion as well as at the bottom portion 6b.

When, from the state (II), the hinges 41 and the tubular member 43 are rotated in a clockwise direction by an angle of 90 degrees and further the hinges 42 and the tubular member 44 are rotated in a clockwise direction by an angle of 90 degrees, the keyboard unit 2 is brought to a position as shown by a dotted line (III) in FIG. 2B in which the keyboard unit 2 is superposed on the main body unit 1 with the front side surface of the keyboard unit 2 contacting the bottom or back surface of the main body unit. This state (III) is convenient for manipulating the apparatus while holding it on a user's hand. In the state (III), the flexible cable 6 is twisted at the leg portions 6a extending along the axes of the hinges and is curved at the inlet and outlet of the hinge portions as well as at the bottom portion 6b.

When the hinges 42 and the tubular member 44 are rotated in a clockwise direction by and angle of 180 degrees from the closed state (I), the keyboard unit 1 is brought into an opened position as shown by a solid line (IV) in FIG. 2C. When the hinges 41 and the tubular member 43 as well as the hinges 42 and the tubular member 44 are further rotated in a clockwise direction by suitable angles from the state (IV), the keyboard unit 2 is brought into a position shown by a dotted line (V) in FIG. 2C in which the front or outer surface of the keyboard unit 1 can be contacted with a table, for example.

In the above-described embodiments, the flexible cable is designed to be twisted and curved. However, it is possible to construct the electronic apparatus of the invention such that the flexible cable is merely twisted without being curved or bent.

Figure 6:
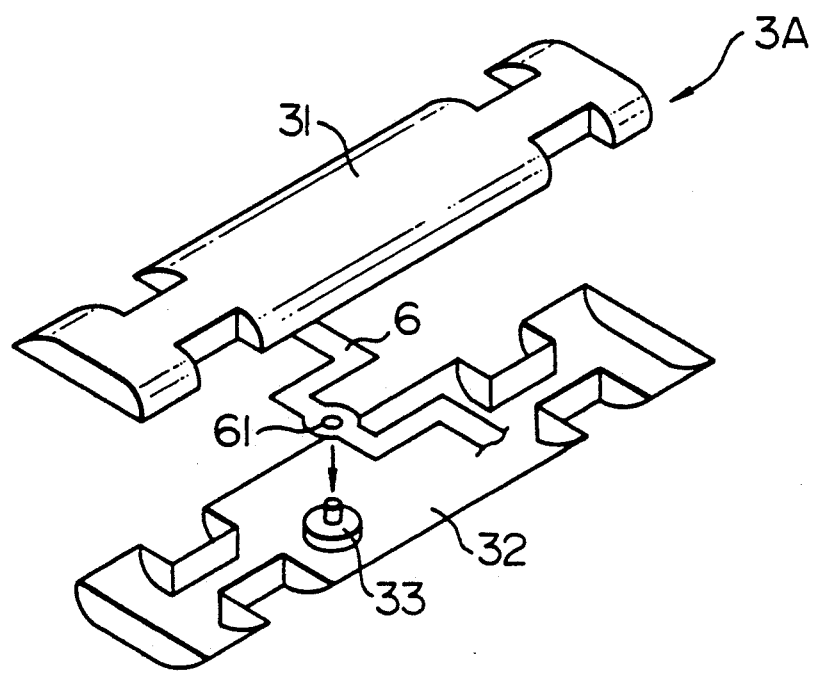
FIG. 6 is a perspective view showing essential portions of an electronic apparatus according to a fourth embodiment of the invention.

In the fourth embodiment of the invention as shown in FIG. 6, a holding member 3A is constituted from a pair of parts 31 and 32, one of which is provided with a projection 33. The flexible cable 6 is formed in the middle portion thereof with a small hole 61 for 5 positioning. After fitting the projection 33 in the small hole 61, the flexible cable 6 is sandwiched between the two parts 31, 32 so that the holding member 3A and the flexible cable 6 are united into one body. With such construction, the flexible cable is merely twisted without being curved or bent. In this case, the flexible cable 6 is not required to be bent in the shape of the letter U but may be formed into a horizontally straight line shape.

As will be apparent from the foregoing description, in the electronic apparatus according to the invention, since the main body unit and the keyboard unit are connected together through the hinge portion of the double-hinge construction, they can be rotated relative to each other through an increased angle (360 degrees, for example). Thus, the breakage of the hinge portion can be prevented. In addition, the apparatus has an excellent operational ability whichever it is operated as it is put on the user's hand or on the table in intimate contact therewith.

When the flexible cable is bent in the shape of the letter U in the hinge portions and the cable is made to be twisted and curved or bent, as in the illustrated embodiments, the possibility of an excessive force being applied to the flexible cable can be avoided even if the width of the hinge portion is designed to be small and even if the hinges are rotated by an angle of 360 degrees.

Consequently, the invention makes it possible to decrease the width of the hinge portion and hence to reduce the size of the apparatus. Further, by adopting the structure of the fourth embodiment as shown in FIG. 6, it is possible to facilitate assembling of the flexible cable into the apparatus.

What is claimed is:

1. An electronic apparatus comprising:
a main body unit including a lower body and an upper body which are connected together;
a keyboard unit;
hinge means mechanically connecting said main body unit with said keyboard unit; and
a flexible cable electrically connecting said main body unit with said keyboard unit;
said hinge means including (a) a first hinge portion including a first hinge connected to a longitudinal edge of said lower body, a second hinge connected to said longitudinal edge, a firs semicircular member connected to said longitudinal edge and disposed between and coaxial with said first hinge and said second hinge, and a second semicircular member connected to a longitudinal edge of said upper body to form a first tubular member with said first semicircular member, (b) a second hinge portion including a third hinge, a fourth hinge and a second tubular member each connected to a longitudinal edge of said keyboard unit, said second tubular member being disposed between and coaxial with said third hinge and said fourth hinge, said cable passing through said first and second tubular members, and (c) a holding member provided between said main body unit and said keyboard unit and rotatably holding said first, second, third and fourth hinges so as to enable said keyboard unit to rotate relative to said main body unit about said first, second, third and fourth hinges.

2. An electronic apparatus according to claim 1, wherein said flexible cable has U-like shape including parallel leg portions and a bottom portion extending between the leg portions, each of said leg portions being disposed along an axis of one of said first and second hinge portions, said bottom portion being disposed in said holding member.

3. An electronic apparatus according to claim 2, wherein said holding member comprises means for causing said flexible cable to undergo twisting and curving movements in response to relative rotation between said main body unit and said keyboard unit.

4. An electronic apparatus according to claim 1, wherein said holding member is divided into two parts, and said flexible cable is disposed between said two parts in a sandwiched manner.

5. An electronic apparatus according to claim 1, wherein said keyboard unit is rotatable relative to said main body unit up to an angle of 360 degrees.

* * * * *